United States Patent [19]
Yanagida

[11] Patent Number: 5,156,320
[45] Date of Patent: Oct. 20, 1992

[54] WIRE BONDER AND WIRE BONDING METHOD

[75] Inventor: Katsuro Yanagida, Tokyo, Japan

[73] Assignee: Kaijo Corporation, Tokyo, Japan

[21] Appl. No.: 841,054

[22] Filed: Feb. 25, 1992

[30] Foreign Application Priority Data

Feb. 27, 1991 [JP] Japan .................................. 3-053517

[51] Int. Cl.[5] .............................................. H01L 21/60
[52] U.S. Cl. .................... 228/102; 228/179; 228/4.5; 228/9
[58] Field of Search ............... 228/102, 179, 4.5, 9, 228/110, 1.1, 904

[56] References Cited

U.S. PATENT DOCUMENTS 5,080,276  1/1992  Kashima et al. .................. 228/4.5

FOREIGN PATENT DOCUMENTS

| 67928 | 4/1986 | Japan ................................ 228/4.5 |
| 159744 | 7/1986 | Japan ................................ 228/4.5 |
| 61-42417 | 9/1986 | Japan . |
| 61-240644 | 10/1986 | Japan . |
| 143541 | 6/1990 | Japan ................................ 228/4.5 |

*Primary Examiner*—Samuel M. Heinrich
*Attorney, Agent, or Firm*—Sughrue, Mion, Zinn, Macpeak & Seas

[57] ABSTRACT

A wire bonder and wire bonding method where there is repeatedly calculated the dislocation dy of the end of a capillary, based on the oscillation an elevation angle of a bonding arm which performs oscillating motion, on the end of which said capillary is provided. As a result of controlling the driving of an XY table based on the dislocation dy, the position of the end of the capillary is successively corrected so that the end of said capillary is positioned on a straight line which connects a first bonding point and a second bonding point.

4 Claims, 3 Drawing Sheets

WIRE BONDER AND WIRE BONDING METHOD

BACKGROUND OF THE INVENTION

1. Field of the Invention

The present invention relates to a wire bonder which performs assembly of semiconductor integrated circuits (IC), etc., and more particularly, relates to a wire bonder and wire bonding method which are able to linearly connect wire between a pad (electrode) of a semiconductor pellet (IC pellet) and a lead arranged on a lead frame.

2. Description of the Prior Art

With respect to the prior art, in the case of manufacturing semiconductor integrated circuits (IC) or large-scale integrated circuits (LSI), by displacing a bonding tool (capillary) holding a wire with respect to a lead frame and an IC pellet, after positioning said lead frame on which said IC pellet is arranged on a conveyor device, bonding is performed by respectively guiding the wire to a lead arranged on said lead frame and a pad on said IC pellet. A wire bonder like that indicated in FIG. 1 is used for this type of bonding.

In FIG. 1, the bonding head is comprised of ultrasonic vibrator 10, supported to allow oscillation (up and down movement) by means of support shaft 13 provided on frame 12 provided on XY table 11, which is capable of moving two-dimensionally in the X and Y directions; bonding arm 14 provided on the end of said ultrasonic vibrator 10; capillary 22 mounted on the end of said bonding arm 14, lever 15 mounted on the other end of ultrasonic vibrator lo, and roller 16 provided on the end of said lever 15.

Roller 16 is comprised so as to receive a moment in the counterclockwise direction from spring 18 so as to make contact with cam 17. As a result of cam 17 being rotated by a driving device such as a pulse motor, capillary 22 is able to move up and down in an oscillating fashion due to the shape of said cam 17. In addition, wire 4, made of aluminum or gold, is wound about rotatable supply reel 19 on a support frame on XY table 11. The wire 4 is pulled out to a specified length from the end of capillary 22 by means of half clamp 20 and clamp 21.

The following describes the procedure by which bonding work is performed using the device comprised as mentioned above.

Firstly, a specified length of wire 4 is extended from the end of capillary 22. After forming a ball (not shown) on the end of wire 4 with a torch (an electric discharge device not shown), capillary 22 is positioned at a location directly above pad 3 formed on IC pellet 2 placed on bonding stage 1 by moving XY table 11.

Next, capillary 22 is lowered by rotating cam 17. The ball formed on the end of capillary 22 is brought in contact with pad 3 on IC pellet 2 to crush the ball resulting in connection at the first bonding point. Simultaneous to this crushing, ultrasonic vibrator 10 is operated to subject capillary 22 to ultrasonic vibration, and bonding stage 1 is heated by means of a heating device (not shown). Then, after capillary 22 is moved upwards and horizontally to position it above the lead to be bonded, capillary 22 is lowered to partially crush wire 4. This results in the formation of a flattened portion which makes a connection at the second bonding point as a result of being fixed to the lead through the combined use of ultrasonic vibration and heating. Wire 4 is then pulled back and cut from the edge of the flattened portion. One round of bonding is thus completed with the raising of the capillary. In the connection of wire 4 by means of the wire bonding procedure described above, since wire 4 forms a wire loop as indicated by the broken line in FIG. 4(A), it follows that pad 3, the first bonding point, and lead 5, the second bonding point, are nominally connected by a straight line.

In the wire bonder of the prior art, however, although capillary 22 moves in the Z (upward) direction when bonding arm 14 oscillates by angle $\theta$ around support shaft 13 as the center of rotation, since the end of capillary 22 moves in the form of a circular arc about the pivot point 13 during said oscillating motion, bonding arm 14 ends up being dislocated horizontally by the amount dy in the direction of axis Y—Y' (see FIG. 2) As dislocation dy becomes larger in proportion to angle $\theta$ (angle $\theta$ is not constant), when bonding is performed with lead 5 as the second bonding point by moving XY table 11 two-dimensionally in the X and Y directions while still in this dislocated state, the end of capillary 22 does not follow a linear path, but rather follows an arcuate path. Consequently, this results in a curved wire being extended between the two bonding points as indicated in FIG. 4(A). Thus, the prior art has the disadvantage that curved wire 4 may make contact with an adjacent wire 4, resulting in the risk of the occurrence of broken wires and other problems contributing to defective bonding.

SUMMARY OF THE INVENTION

Accordingly, the object to the present invention is to provide a wire bonder in which the amount of dislocation of the end of a capillary is calculated and determined according to the oscillation angle of said capillary so that wire can be connected along a straight line between a first bonding point and a second bonding point by controlling the movement of an XY table based on the amount of said dislocation so determined, thus overcoming the above-described problems of the prior art.

According to a first embodiment of the invention, the invention comprises: an XY table capable of at least two-dimensional movement; a support shaft provided on a frame on said XY table; a bonding arm on the and of which is provided a capillary, and which is capable of oscillation centering around said support shaft; an angle measuring device which measures the oscillation angle of said bonding arm; and a control device which calculates the amount of dislocation of the end of said capillary, determining the oscillation angle from the output of said angle measuring device, and controls said XY table based on that calculated value; wherein, said control device successively calculates the amount of dislocation according to the instantaneous angle of elevation of said capillary when moving between a first bonding point and a second bonding point, so that the position of the end of said capillary is successively corrected so that the it is positioned on a straight line which connects said first bonding point and said second bonding point.

In addition, according to a second embodiment, the invention comprises: an XY table capable of at least two-dimensional movement; a support shaft provided on a frame on said XY table; a bonding arm on the end of which is provided a capillary, and which is capable of oscillation centering around said support shaft; an angle measuring device which measures the oscillation (elevation) angle of said bonding arm; and a control device which calculates the amount of dislocation of the end of said capillary, determining the oscillation angle from the output of said angle measuring device, and controls said XY table based on that calculated value; wherein, the end of said capillary and the shaft center of said support shaft, which serves as the center of oscillation around which said bonding arm oscillates, are at the same height.

In addition, according to a third embodiment, related to the inventive method, the invention successively determines the amount of dislocation of the end of a capillary according to the oscillation angle of a bonding arm, on the end of which is provided said capillary, and which performs oscillating movement centering around a support shaft, wherein the position of the end of said capillary is successively corrected so that it is positioned on a straight line which connects a first bonding point and a second bonding point as a result of controlling an XY table based on the amount of said dislocation.

DESCRIPTION OF THE PREFERRED EMBODIMENTS

The following provides a description of the preferred embodiments of the wire bonder of the present invention. The following description focuses primarily on those points which differ from the prior art, while those preferred embodiments which possess components and functions which are generally the same as devices of the prior art are described using the same symbols.

Figure 1:
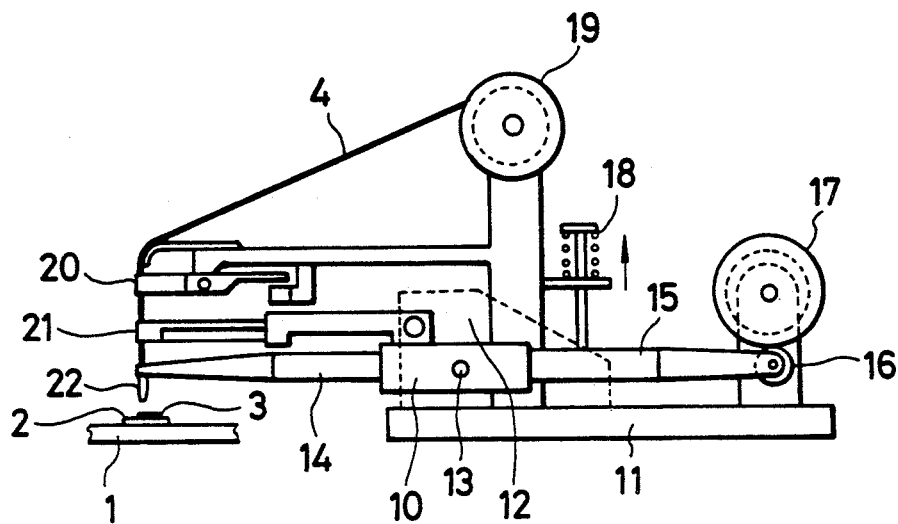
FIG. 1 is a front view which indicates the composition of the wire bonder of the prior art.
Figure 2:
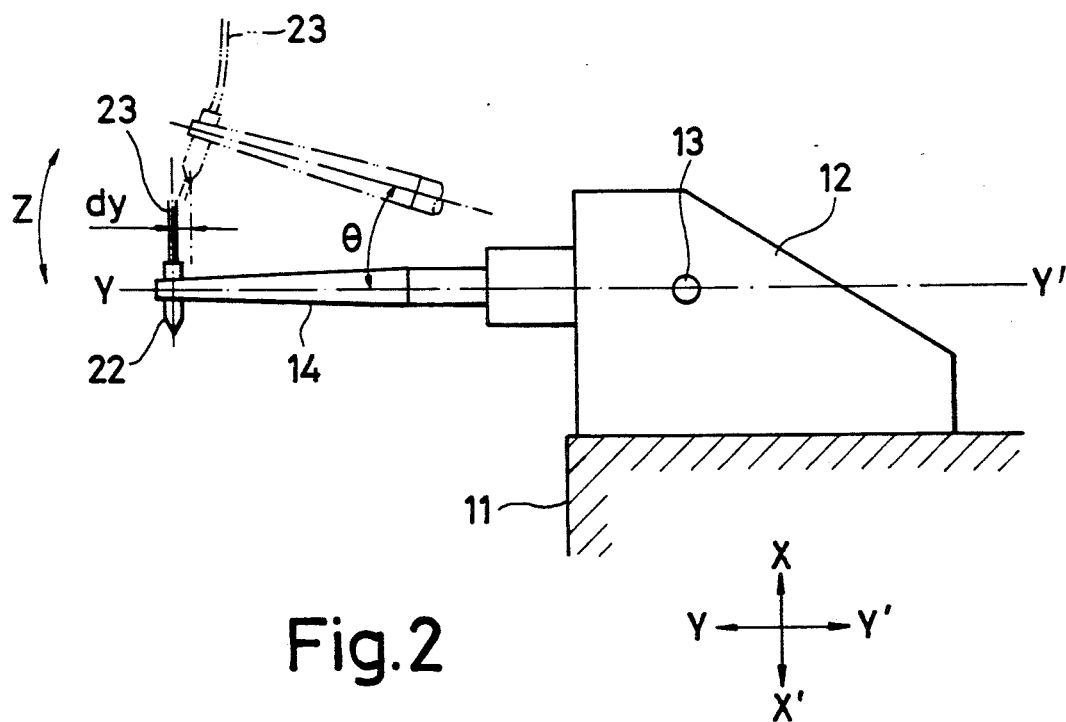
FIG. 2 is an explanatory drawing for explaining the source and amount of dislocation resulting from use of the bonding head of device indicated in FIG. 1.
Figure 3:
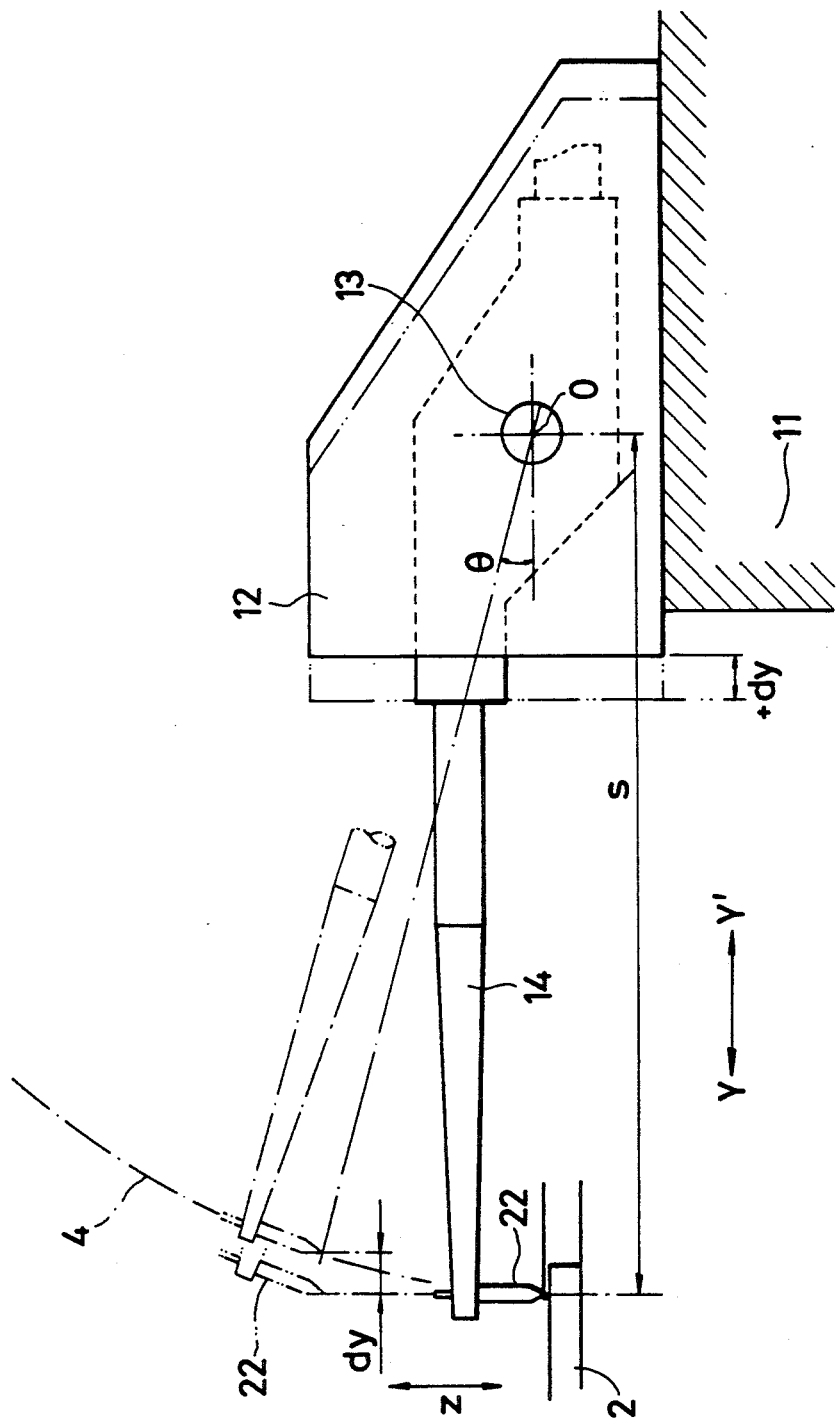
FIG. 3 is a front view which indicates the state in which the bonding head of the wire bonder of the present invention performs bonding at the first bonding point.

In FIG. 3, a bonding head is constructed to allow oscillation by means of support shaft 13 provided on frame 12 provided on XY table 11 which is capable of two-dimensional movement in the X and Y directions. The power source for the driving of this oscillating movement may involve a system which transfers driving force to cam 17 as in the device of the prior art, or a linear motor and so on.

The shaft center of bonding arm 14 is set so as to be horizontal when wire 4 is connected to pad 3 of IC pellet 2 as indicated in FIG. 3. Thus, when capillary 22 is brought in contact with the upper surface of pad 3 of IC pellet 2, the end of capillary 22 and shaft center O of support shaft 13 are aligned at the same height.

Due to this configuration, although dislocation in the direction of Y—Y' by the amount dy occurs as a result of capillary 22 following an accurate path accompanying oscillating motion by bonding arm 14, this amount of dislocation dy can be easily determined if angle $\theta$ is known since the distance S from the center of support shaft 13 to the center of capillary 22 is known in advance. This distance S is stored in advance as data in a control device (not shown) comprised of a microcomputer or similar device by means of self-teaching during which operating conditions and so on are set. The control device then counts a series of pulses which are output, corresponding to the angle of rotation, from an angle measuring device, comprised of a rotary encoder (not shown) or similar device, mounted on support shaft 13. Angle $\theta$ is then determined by calculation based on the value of the pulses counted. Furthermore, in this preferred embodiment, since the position of the end of capillary 22 and the shaft center of support shaft 13 are made to be at the same height, base line adjustment of the angle measuring device, or in other words, offset adjustment, can be performed easily. The amount of dislocation dy is then determined based on this data.

Figure 4:
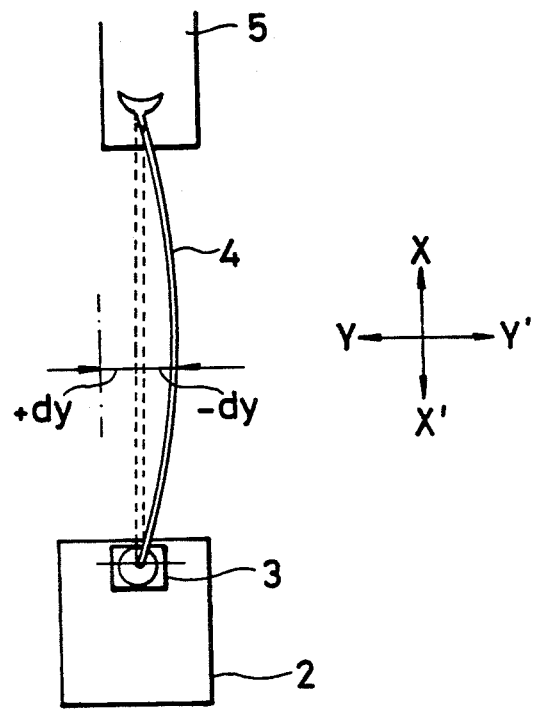
FIG. 4(A) and 4(B) are respectively a top view and a side view of the state in which the wire is connected by the device indicated in FIG. 3.
Figure 4:
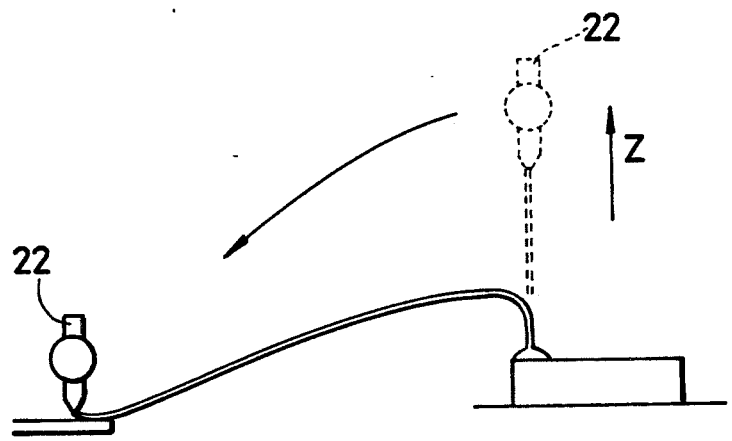

The following provides a description of the correction method in the process by which bonding is performed by moving capillary 22 from above pad 3, the first bonding point, to lead 5, the second bonding point, by the operation of XY table 11 as indicated in FIG. 4(B).

Firstly, when the end of capillary 22 of bonding arm 14 is oscillated by angle 0 as indicated in FIG. 3, the end of capillary 22 is dislocated by amount dy. As a result, XY table 11 is moved in the direction of Y—Y' by the amount +dy indicated by the dot-chain line in FIG. 3. The end of capillary 22 is then corrected so as to be positioned on a straight line which connects pad 3, the first bonding point, and lead 5, the second bonding point, as indicated with a broken line in FIG. 4(A). Although the position of XY table 11 at this time is on the coordinates indicated by +dy, the position of the end of capillary 22 has been moved back by the amount of −dy so that the wire is positioned on the above-mentioned straight line.

However, since the elevation in the Z direction and thus the angle of bonding arm 14 changes during movement from the first bonding point to the second bonding point, the amount of dislocation dy must be successively determined according to the instantaneous angle of rotation $\theta$ to continuously correct the movement of XY table 11 according to that determined value.

As has been described above, since the end of a capillary can be positioned on a straight line which connects a first bonding point and a second bonding point, the present invention offers the advantage of allowing the formation of a wire loop resulting in high-quality wire bonding. Thus, there is no risk of the occurrence of defective bonding resulting from contact between the bonding wire and an adjacent wire, broken wires or other problems. In addition, since the shaft center at which the bonding arm is supported and the position of the end of the capillary are horizontally aligned, the present invention offers the advantage that calculating the amount of dislocation of the capillary and calculating the angle are easy.

What is claimed is:

1. A wire bonder, comprising:
an XY table capable of at least two-dimensional movement; a support shaft provided on a frame on said XY table; a bonding arm at the end of which is provided a capillary, and which is capable of oscillating centered about said support shaft; an angle measuring device which measures an oscillation angle of said bonding arm; and, a control device which calculates the amount of dislocation of the end of said capillary based on the oscillating angle measured by said angle measuring device, and controls said XY table based on the calculated dislocation so as to compensate said calculated dislocation.

2. A wire bonder as claimed in claim 1, wherein said control device successively calculates the amount of dislocation according to the angle of elevation of said capillary as said capillary moves between a first bonding point and a second bonding point, so that the position of the end of said capillary is successively corrected so that it is positioned on a straight line which connects said first bonding point and said second bonding point.

3. A wire bonder, comprising:
an XY table capable of at least two-dimensional movement; a support shaft provided on a frame on said XY table; a bonding arm at the end of which is provided a capillary, and which is capable of oscillation centered about said support shaft; an angle measuring device which measures an oscillation angle of said bonding arm; and, a control device which calculates the amount of dislocation of the end of said capillary based on the oscillation angle measured by said angle measuring device, and controls said XY table based on the calculated dislocation wherein the end of said capillary and the shaft center of said support shaft, which serves as the center of oscillation around which said bonding arm oscillates, are in the same horizontal plane.

4. A wire bonding method, comprising; successively measuring an inclination angle of a capillary provided at the end of an oscillating bonding arm;
determining an amount of dislocation of said capillary based on the measured angle; and
using said dislocation amount to correct the position of an end of said capillary so that said end remains positioned on a straight line which connects a first bonding and a second bonding point as said capillary is moved from said first bonding point to said second bonding point.

* * * * *